(12) United States Patent
Lee

(10) Patent No.: US 10,601,406 B2
(45) Date of Patent: Mar. 24, 2020

(54) SEMICONDUCTOR APPARATUS

(71) Applicant: SK hynix Inc., Icheon-si, Gyeonggi-do (KR)

(72) Inventor: Seung Ho Lee, Seoul (KR)

(73) Assignee: Sk hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/227,975

(22) Filed: Dec. 20, 2018

(65) Prior Publication Data

US 2019/0372562 A1 Dec. 5, 2019

(30) Foreign Application Priority Data

May 31, 2018 (KR) .......... 10-2018-0063012

(51) Int. Cl.
*H03K 3/02* (2006.01)
*H03L 7/00* (2006.01)
*H03K 3/3565* (2006.01)
*H03K 5/24* (2006.01)
*G01R 19/165* (2006.01)
*H03K 19/20* (2006.01)
*H03K 5/00* (2006.01)

(52) U.S. Cl.
CPC ..... *H03K 3/3565* (2013.01); *G01R 19/16595* (2013.01); *H03K 5/2472* (2013.01); *H03K 19/20* (2013.01); *H03K 2005/00013* (2013.01)

(58) Field of Classification Search
CPC .... H03K 3/3565; H03K 19/20; H03K 5/2472; H03K 2005/00013; G01R 19/16595
See application file for complete search history.

(56) References Cited

U.S. PATENT DOCUMENTS

| 6,204,701 | B1 | 3/2001 | Tsay et al. |
| 7,161,396 | B1 | 1/2007 | Zhou et al. |
| 8,803,580 | B2 * | 8/2014 | Shi ........................ H03K 17/20 327/143 |

FOREIGN PATENT DOCUMENTS

KR 1020080038954 A 5/2008

* cited by examiner

*Primary Examiner* — Kenneth B Wells
(74) *Attorney, Agent, or Firm* — William Park & Associates Ltd.

(57) ABSTRACT

A semiconductor apparatus includes a first voltage detection circuit configured to generate a first voltage detection signal in response to the voltage level of a first voltage, a current control signal and a second voltage detection signal; and a storage and output circuit configured to generate a power control signal and the current control signal in response to the voltage detection signal.

16 Claims, 8 Drawing Sheets

SEMICONDUCTOR APPARATUS

CROSS-REFERENCES TO RELATED APPLICATION

The present application claims priority under 35 U.S.C. § 119(a) to Korean application number 10-2018-0063012, filed on May 31, 2018, in the Korean Intellectual Property Office, which is incorporated herein by reference in its entirety.

BACKGROUND

1. Technical Field

Various embodiments generally relate to a semiconductor integrated circuit, and more particularly, to a semiconductor apparatus.

2. Related Art

A semiconductor apparatus is developed to transmit/receive a larger amount of data at high speed.

In order to normally transmit/receive a larger amount of data at high speed, the semiconductor apparatus is designed in such a manner that a voltage used therein is divided into a voltage used by circuits that transmit/receive data and a voltage used by circuits that do not transmit/receive data.

The semiconductor apparatus is designed to operate based on voltages received from a plurality of voltage sources, and developed to reduce power consumption used therein.

SUMMARY

In an embodiment, a semiconductor apparatus may include a first voltage detection circuit configured to generate a first voltage detection signal in response to the voltage level of a first voltage, a current control signal and a second voltage detection signal; and a storage and output circuit configured to generate a power control signal and the current control signal in response to the voltage detection signal.

In an embodiment, a semiconductor apparatus may include: a first voltage detection circuit configured to enable a first voltage detection signal when the voltage level of a first voltage becomes higher than a first set voltage level; a second voltage detection circuit configured to enable a second voltage detection signal when the first voltage detection signal is enabled and the voltage level of a second voltage becomes higher than a second set voltage level, and configured to disable the second voltage detection signal in response to a current control signal; and a storage and output circuit configured to enable the current control signal when the second voltage detection signal is enabled, and configured to generate a power control signal by latching the enabled second voltage detection signal.

In an embodiment, a semiconductor apparatus may include: a first voltage detection circuit configured to enable a first voltage detection signal when the voltage level of a first voltage becomes higher than a first set voltage level; a second voltage detection circuit configured to enable a second voltage detection signal when the first voltage detection signal is enabled and the voltage level of a second voltage becomes higher a second set voltage level, and disable the second voltage detection signal when the voltage level of the first voltage becomes higher the first set voltage level and the second voltage is lower than the second set voltage level; and a storage and output circuit configured to enable the current control signal when the second voltage detection signal is enabled, and generate a power control signal by latching the enabled second voltage detection signal.

In an embodiment, a semiconductor apparatus may include: a data input/output circuit configured to operate by receiving a first voltage; a core circuit configured operate by receiving a second voltage; and a control circuit configured to output a power control signal for activating the data input/output circuit when the first voltage is higher than a first set voltage and the second voltage is higher a second set voltage.

DETAILED DESCRIPTION

Hereinafter, a semiconductor apparatus according to the present disclosure will be described below with reference to the accompanying drawings through exemplary embodiments.

Various embodiments are directed to a semiconductor apparatus capable of reducing power consumption.

Figure 1:
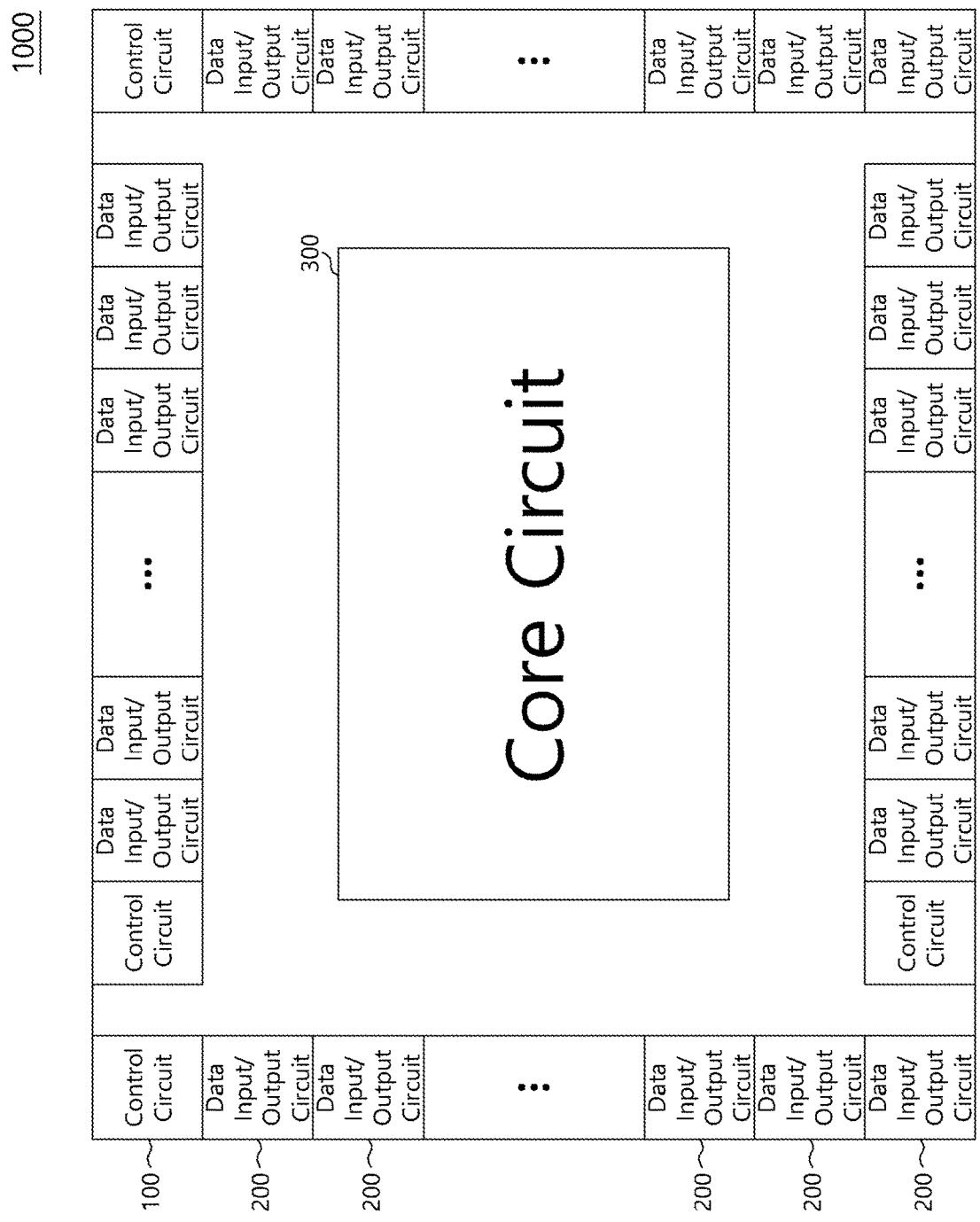
FIG. 1 is a configuration diagram illustrating a semiconductor apparatus in accordance with an embodiment.

As illustrated in FIG. 1, a semiconductor apparatus 1000 in accordance with an embodiment may include a plurality of control circuits 100, a plurality of data input/output circuits 200 and a core circuit 300.

Each of the control circuits 100 may detect a first voltage used in the core circuit 300 and a second voltage used in the data input/output circuits 200. Each of the control circuits 100 may activate or deactivate the data input/output circuits 200. For example, when both of the first and second voltages become equal to or higher than a set voltage level, each of the control circuits 100 may activate the plurality of data input/output circuits 200. On the other hand, when any one of the first and second voltages becomes lower than the set voltage level, each of the control circuits 100 may deactivate the plurality of data input/output circuits 200.

The plurality of data input/output circuits 200 may be activated to transmit data outputted from the core circuit 300 or receive data to be inputted to the core circuit 300. On the other hand, the plurality of data input/output circuits 200 may be deactivated to convert the state of an output node into a high impedance state.

The core circuit 300 may be configured to store data transferred from the plurality of data input/output circuits 200 or transfer data stored therein to the plurality of data input/output circuits 200.

Figure 2:
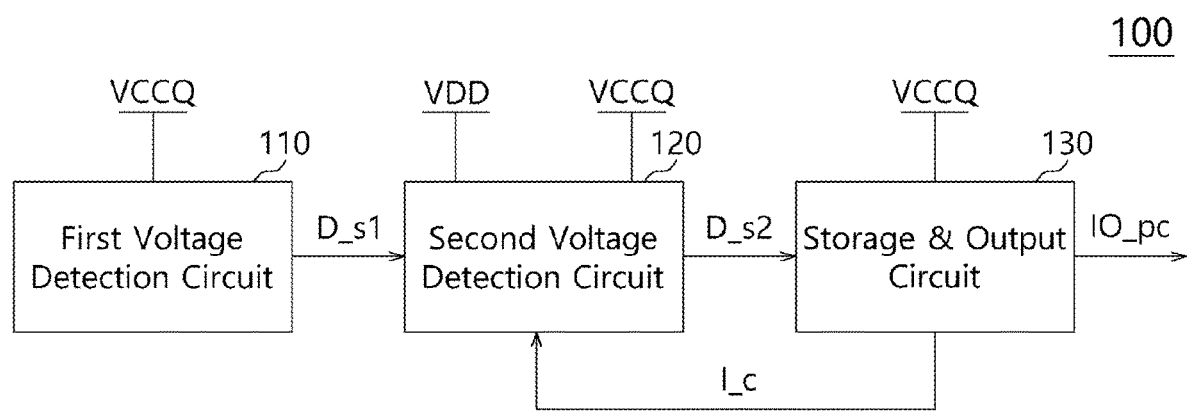
FIG. 2 is a configuration diagram illustrating a control circuit of FIG. 1.

FIG. 2 is a configuration diagram illustrating one control circuit 100 among the plurality of control circuits 100 illustrated in FIG. 1.

As illustrated in FIG. 2, the control circuit 100 may include a first voltage detection circuit 110, a second voltage detection circuit 120 and a storage and output circuit 130.

The first voltage detection circuit 110 may generate a first voltage detection signal D_s1 in response to the voltage level of a first voltage VCCQ. For example, when the voltage level of the first voltage VCCQ becomes equal to or higher than a first set voltage level, the first voltage detection circuit 110 may enable the first voltage detection signal D_s1 at a high level. On the other hand, when the voltage level of the first voltage VCCQ is lower than the first set voltage level, the first voltage detection circuit 110 may disable the first voltage detection signal D_s1 at a low level.

The second voltage detection circuit 120 may generate a second voltage detection signal D_s2 in response to the first voltage detection signal D_s1, a current control signal I_c and a second voltage VDD. For example, when the first voltage detection signal D_s1 is enabled and the voltage level of the second voltage VDD becomes equal to or higher than a second set voltage level, the second voltage detection circuit 120 may enable the second voltage detection signal D_s2 at a high level. On the other hand, when the first voltage detection signal D_s1 is disabled, the second voltage detection circuit 120 may disable the second voltage detection signal D_s2 at a low level. When the current control signal I_c is enabled at a high level, the second voltage detection circuit 120 may disable the second voltage detection signal D_s2 at a low level. Furthermore, when the current control signal I_c is enabled at a high level, the second voltage detection circuit 120 can reduce power or current consumption thereof.

The storage and output circuit 130 may generate a power control signal IO_pc in response to the second voltage detection signal D_s2. For example, when the second voltage detection signal D_s2 is enabled, the storage and output circuit 130 may enable the current control signal I_c, latch the enabled second voltage detection signal D_s2, and output the latched signal as the power control signal IO_pc. On the other hand, when the second voltage detection signal D_s2 is disabled, the storage and output circuit 130 may disable the current control signal I_c and disable the power control signal IO_pc at a low level.

At this time, the first voltage VCCQ may be supplied to the plurality of data input/output circuits 200 of FIG. 1, and the second voltage VDD may be supplied to the core circuit 300 of FIG. 1. The power control signal IO_pc may be inputted to the plurality of data input/output circuits 200. The plurality of data input/output circuits 200 may be activated when the power control signal IO_pc is enabled, and deactivated when the power control signal IO_pc is disabled.

Figure 3:
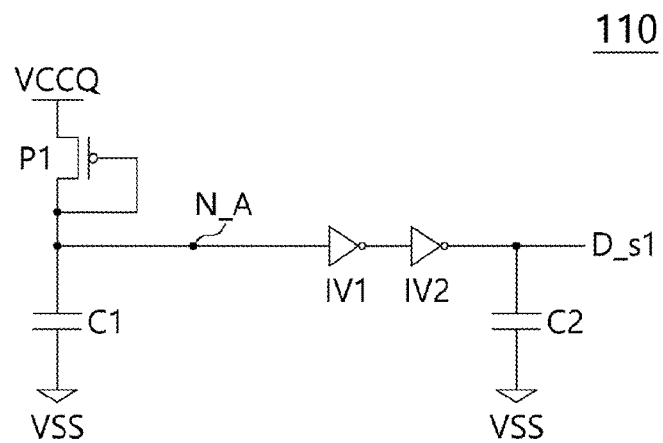
FIG. 3 is a configuration diagram illustrating a first voltage detection circuit of FIG. 2.

FIG. 3 is a configuration diagram illustrating the first voltage detection circuit 110 of FIG. 2.

As illustrated in FIG. 3, the first voltage detection circuit 110 may include a first transistor P1, a first capacitor C1, and a second capacitor C2. The first voltage detection circuit 110 may also be configured to perform a first inversion operation and a second inversion operation. For example, the first voltage detection circuit 110 may include a first inverter IV1 and a second inverter IV2.

The first transistor P1 may have a source configured to receive the first voltage VCCQ and a drain and gate coupled to a first node N_A in common.

The first capacitor C1 may have one terminal coupled to the first node N_A and the other terminal coupled to a ground terminal VSS.

The first inverter IV1 may have an input terminal coupled to the first node N_A.

The second inverter IV2 may have an input terminal coupled to an output terminal of the first inverter IV1 and an output terminal configured to output the first voltage detection signal D_s1.

The second capacitor C2 may have one terminal coupled to the output terminal of the second inverter IV2 and the other terminal coupled to the ground terminal VSS.

Figure 4:
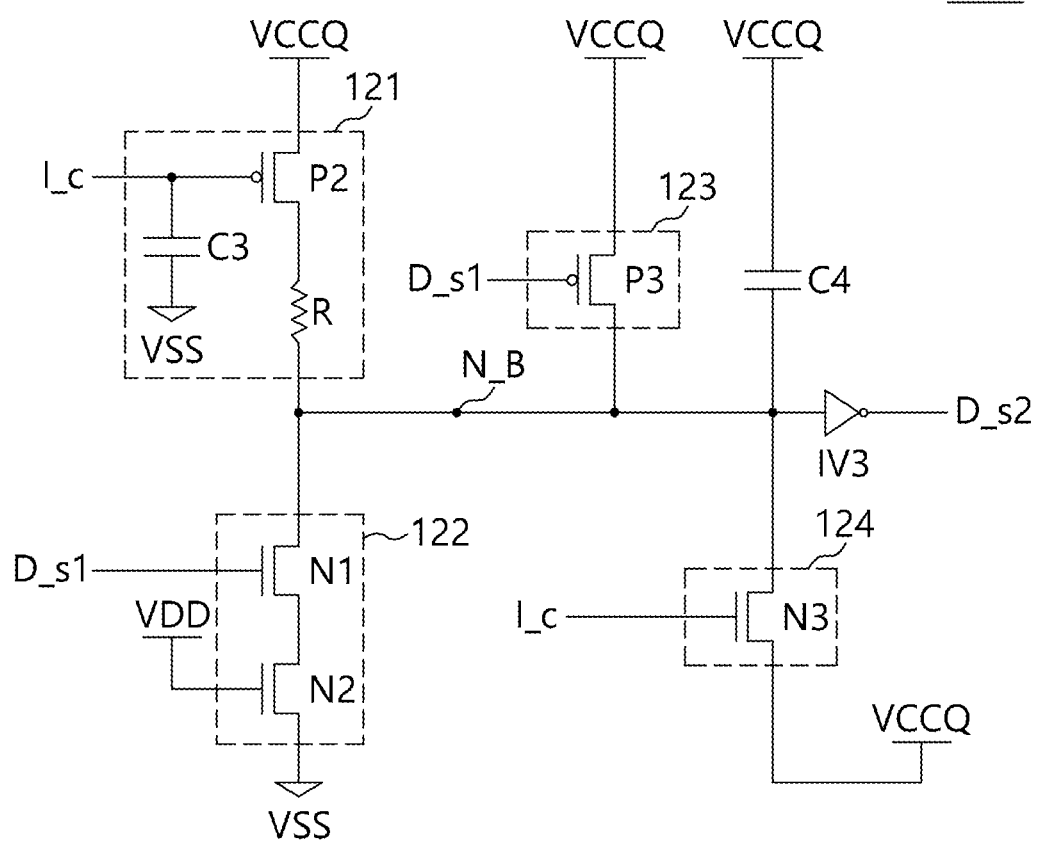
FIG. 4 is a configuration diagram illustrating a second voltage detection circuit of FIG. 2.

FIG. 4 is a configuration diagram illustrating the second voltage detection circuit 120 of FIG. 2.

As illustrated in FIG. 4, the second voltage detection circuit 120 may include a first current source circuit 121, a first current sink circuit 122, a second current source circuit 123, a third current source circuit 124, and a third capacitor C3. The second voltage detection circuit 120 may also be configured to perform a third inversion operation. For example, second voltage detection circuit 120 may include a third inverter IV3.

The first current source circuit 121 may supply a current to the second node N_B in response to the current control signal I_c. For example, when the current control signal I_c is disabled at a low level, the first current source circuit 121 may raise the voltage level of the second node N_B by supplying a current to the second node N_B. On the other hand, when the current control signal I_c is enabled at a high level, the first current source circuit 121 may stop supplying the current to the second node N_B.

The first current source circuit 121 may include a third capacitor C3, a second transistor P2 and a resistor R.

The third capacitor C3 may have one terminal coupled to a gate of the second transistor P2 and the other terminal coupled to the ground terminal VSS.

The second transistor P2 may have the gate configured to receive the current control signal I_c, a source configured to receive the first voltage VCCQ, and a drain coupled to one terminal of the resistor R.

The resistor R may have the one terminal coupled to the drain of the second transistor P2 and the other terminal coupled to the second node N_B.

When the first voltage detection signal D_s1 is enabled and the voltage level of the second voltage VDD becomes equal to or higher than the second set voltage level, the first current sink circuit 122 may lower the voltage level of the second node N_B by passing the current of the second node N_B to the ground terminal VSS.

The first current sink circuit 122 may include third and fourth transistors N1 and N2.

The third transistor N1 may have a gate configured to receive the first voltage detection signal D_s1 and a drain coupled to the second node N_B.

The fourth transistor N2 may have a gate configured to receive the second voltage VDD, a drain coupled to the source of the third transistor N1, and a source coupled to the ground terminal VSS.

When the first voltage detection signal D_s1 is disabled, the second current source circuit 123 may raise the voltage level of the second node N_B by supplying a current to the second node N_B.

The second current source circuit 123 may include a fifth transistor P3.

The fifth transistor P3 may have a gate configured to receive the first voltage detection signal D_s1, a source configured to receive the first voltage VCCQ, and a drain coupled to the second node N_B.

When the current control signal I_c is enabled, the third current source circuit 124 may lower the voltage level of the second node N_B by passing the current of the second node N_B to the ground terminal VSS.

The third current source circuit 124 may include a sixth transistor N3.

The sixth transistor N3 may have a gate configured to receive the current control signal I_c, a drain coupled to the second node N_B, and a source configured to receive the first voltage VCCQ.

The fourth capacitor C4 may have one terminal configured to receive the first voltage VCCQ and the other terminal coupled to the second node N_B.

The third inverter IV3 may invert the voltage level of the second node N_B and output the inverted voltage level as the second voltage detection signal D_s2. The third inverter IV3 may have an input terminal coupled to the second node N_B and an output terminal configured to output the second voltage detection signal D_s2. Therefore, the second node N_B may serve as an input node of the third inverter IV3.

Figure 5:
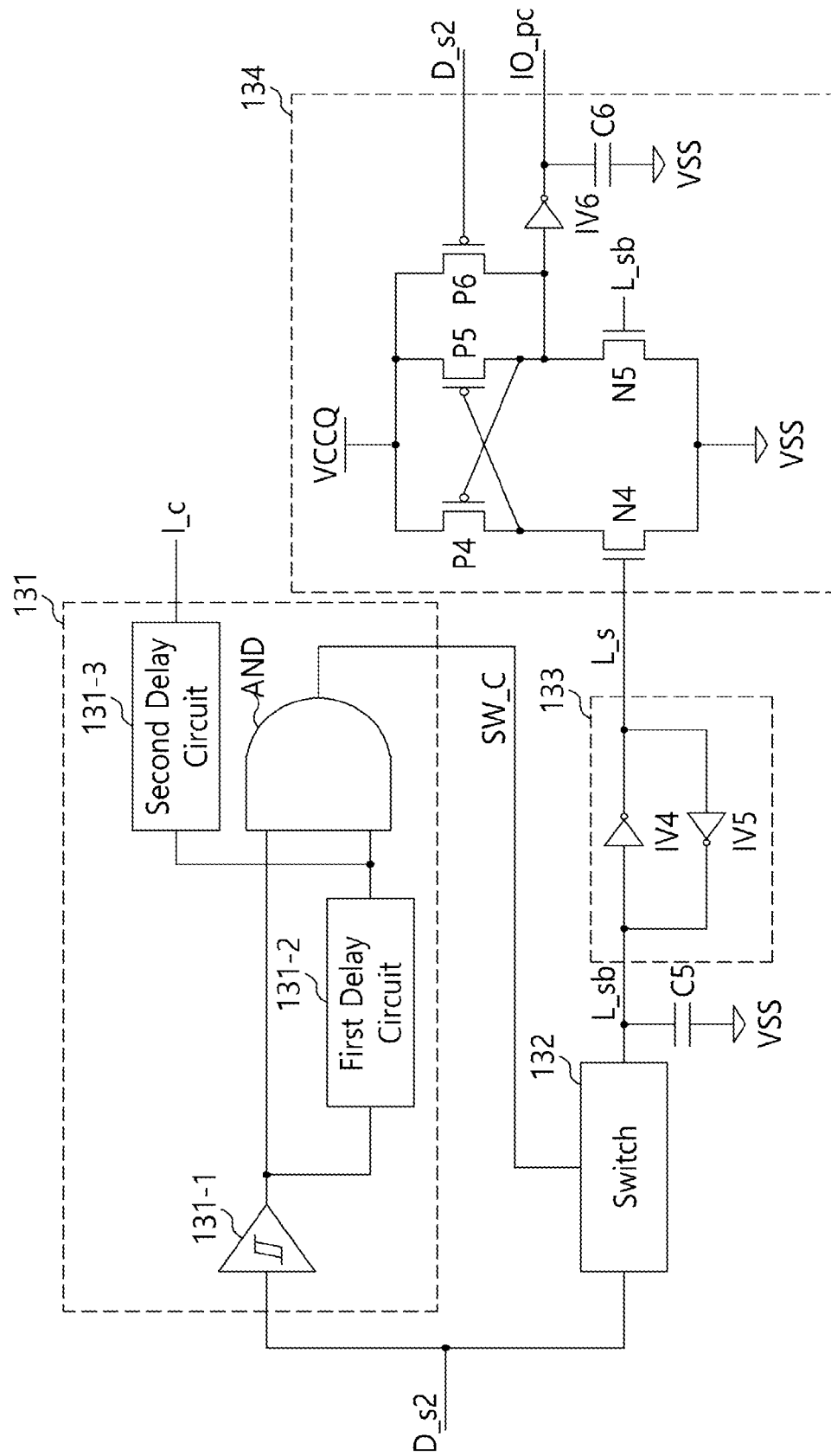
FIG. 5 is a configuration diagram illustrating a storage and output circuit of FIG. 2.

FIG. 5 is a configuration diagram illustrating the storage and output circuit 130 of FIG. 2.

As illustrated in FIG. 5, the storage and output circuit 130 may include a control signal generation circuit 131, a switch 132, a latch circuit 133, a fifth capacitor C5 and a power control signal output circuit 134.

The control signal generation circuit 131 may enable a switch control signal SW_c and the current control signal I_c when the second voltage detection signal D_s2 is enabled. For example, when the second voltage detection signal D_s2 is enabled, the control signal generation circuit 131 may enable the switch control signal SW_c for a preset time. Furthermore, the control signal generation circuit 131 may enable the current control signal I_c when the second voltage detection signal D_s2 is enabled, and disable the current control signal I_c when the second voltage detection signal D_s2 is disabled. When enabled by the second voltage detection signal D_s2, the switch control signal SW_c may be disabled after retaining the enabled state for the preset time.

The word "preset" as used herein with respect to a parameter, such as a preset time, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The control signal generation circuit 131 may include a Schmitt trigger circuit 131-1, a first delay circuit 131-2, and a second delay circuit 131-2. The control signal generation circuit 131 may also be configured to perform an AND operation. For example, control signal generation circuit 131 may include an AND gate AND.

The Schmitt trigger circuit 131-1 may generate a high-level output signal when the voltage level of the second voltage detection signal D_s2 becomes higher than a preset voltage level or the second voltage detection signal D_s2 is enabled at a high level. On the other hand, the Schmitt trigger circuit 131-1 may generate a low-level output signal when the voltage level of the second voltage detection signal D_s2 becomes lower than the preset voltage level or the second voltage detection signal D_s2 is disabled at a low level.

The first delay circuit 131-2 may delay and invert the output signal of the Schmitt trigger circuit 131-1, and output the delayed and inverted signal.

The second delay circuit 131-3 may delay and invert the output signal of the first delay circuit 131-2, and output the delayed and inverted signal as the current control signal I_c.

The AND gate AND may receive the output signals of the Schmitt trigger circuit 131-1 and the first delay circuit 131-2, and generate the switch control signal SW_c. For example, the AND gate AND may generate the switch control signal SW_c which is enabled at a high level only during a period in which both of the output signals of the Schmitt trigger circuit 131-1 and the first delay circuit 131-2 are at a high level. At this time, the enable period of the switch control signal SW_c may be equal to the delay time of the first delay circuit 131-2.

When the switch control signal SW_c is enabled, the switch 132 may output the second voltage detection signal D_s2 as a latch inversion signal L_sb. On the other hand, when the switch control signal SW_c is disabled, the switch 132 may stop the operation of outputting the second voltage detection signal D_s2 as the latch inversion signal L_sb.

The latch circuit 133 may latch and invert the latch inversion signal L_sb, and output the latched and inverted signal as a latch signal L_s.

The latch circuit 133 may be configured to perform a fourth and fifth inversion operation. For example, the latch circuit 133 may include fourth and fifth inverters IV4 and IV5.

The fourth inverter IV4 may receive the latch inversion signal L_sb, invert the received signal, and output the inverted signal as the latch signal L_s.

The fifth inverter IV5 may receive the output signal of the fourth inverter IV4, invert the received signal, and output the inverted signal as an input signal of the fourth inverter IV4.

At this time, the fifth capacitor C5 may be coupled to a node to which the switch 132 and the latch circuit 133 are coupled. The fifth capacitor C5 may have one terminal coupled to the node to which the switch 132 and the latch circuit 133 are coupled and the other terminal coupled to the ground terminal VSS. The switch 132 may transfer the second voltage detection signal D_s2 to the latch circuit 133 when the switch control signal SW_c is enabled, and electrically separate the second voltage detection signal D_s2 from the latch circuit 133 when the switch control signal SW_c is disabled.

The power control signal output circuit 134 may be configured to perform a sixth inversion operation. For example, the power control signal output circuit 134 may include seventh to 11th transistors N4, N5 and P4 to P6, a sixth inverter IV6 and a sixth capacitor C6.

The seventh transistor N4 may have a gate configured to receive the latch signal L_s and a source coupled to the ground terminal VSS.

The eighth transistor N5 may have a gate configured to receive the latch inversion signal L_sb and a source coupled to the ground terminal VSS.

The ninth transistor P4 may have a gate coupled to the drain of the eighth transistor N5, a source configured to receive the first voltage VCCQ, and a drain coupled to the drain of the seventh transistor N4.

The tenth transistor P5 may have a gate coupled to the drain of the seventh transistor N4, a source configured to receive the first voltage VCCQ, and a drain coupled to the drain of the eighth transistor N5.

The 11th transistor P6 may have a gate configured to receive the second voltage detection signal D_s2, a source configured to receive the first voltage VCCQ, and a drain coupled to a node to which the eighth and tenth transistors N5 and P5 are coupled in common.

The sixth inverter IV6 may have an input terminal coupled to a node to which the eighth, tenth and 11th transistors N5, P5 and P6 are coupled in common, and an output terminal configured to output the power control signal IO_pc.

The sixth capacitor C6 may have one terminal coupled to the output terminal of the sixth inverter IV6 and the other terminal coupled to the ground terminal VSS.

Referring to FIGS. 2 to 6, the semiconductor apparatus having the above-described configuration in accordance with the present embodiment will be described as follows.

Referring to FIG. 3, the operation of the first voltage detection circuit 110 will be described.

When the voltage level of the first voltage VCCQ becomes higher than the first set voltage level, the first transistor P1 may be turned on to raise the voltage level of the first node N_A. The voltage level of the first node N_A may be outputted as the first voltage detection signal D_s1 through the first and second inverters IV1 and IV2.

Consequently, when the voltage level of the first voltage VCCQ becomes higher than the first set voltage level, the first voltage detection circuit 110 may enable the first voltage detection signal D_s1 at a high level.

Referring to FIG. 4, the operation of the second voltage detection circuit 120 will be described.

When the current control signal I_c is disabled at a low level, the first current source circuit 121 may raise the voltage level of the second node N_B by supplying a current to the second node N_B.

When the first voltage detection signal D_s1 is enabled at a high level and the voltage level of the second voltage VDD becomes higher than the second set voltage level, the first current sink circuit 122 may lower the voltage level of the second node N_B by passing the current of the second node N_B to the ground terminal VSS.

When the first voltage detection signal D_s1 is disabled at a low level, the second current source circuit 123 may raise the voltage level of the second node N_B by supplying a current to the second node N_B.

When the current control signal I_c is enabled at a high level, the third current source circuit 124 may raise the voltage level of the second node N_B by supplying a current to the second node N_B.

The third inverter IV3 may invert the voltage level of the second node N_B and output the inverted voltage level as the second voltage detection signal D_s2.

Consequently, when the first voltage detection signal D_s1 is enabled at a high level and the voltage level of the second voltage VDD becomes higher than the second set voltage level, the second voltage detection circuit 120 may enable the second voltage detection signal D_s2 at a high level. On the other hand, when the first voltage detection signal D_s1 is disabled at a low level or the current control signal I_c is enabled at a high level, the second voltage detection circuit 120 may disable the second voltage detection signal D_s2 at a low level.

Referring to FIG. 5, the operation of the storage and output circuit 130 will be described.

The second voltage detection signal D_s2 may be delayed by the delay times of the first and second delay circuits 131-2 and 131-3, and outputted as the current control signal I_c.

When the second voltage detection signal D_s2 is enabled, the switch control signal SW_c having an enable period corresponding to the delay time of the first delay circuit 131-2 may be generated.

During the enable period of the switch control signal SW_c, the second voltage detection signal D_s2 may be inputted to the latch circuit 133.

The latch circuit 133 may latch the second voltage detection signal D_s2, and output the latched signal as the latch signal L_s and the latch inversion signal L_sb. At this time, the latch signal L_s and the latch inversion signal L_sb may have levels opposite to each other.

When the latch signal L_s is enabled at a high level, the power control signal output circuit 134 may output the power control signal IO_pc which is disabled at a low level. On the other hand, when the latch signal L_s is disabled at a low level, the power control signal output circuit 134 may output the power control signal IO_pc which is enabled at a high level. Furthermore, when the second voltage detection signal D_s2 is disabled at a low level, the power control signal output circuit 134 may output the power control signal IO_pc which is disabled at a low level.

Consequently, when the second voltage detection signal D_s2 is enabled at a high level, the storage and output circuit 130 may output the current control signal I_c and the power control signal IO_pc which are enabled at a high level. When the second voltage detection signal D_s2 is disabled at a low level, the storage and output circuit 130 may output the current control signal I_c and the power control signal IO_pc which are disabled at a low level.

Figure 6:
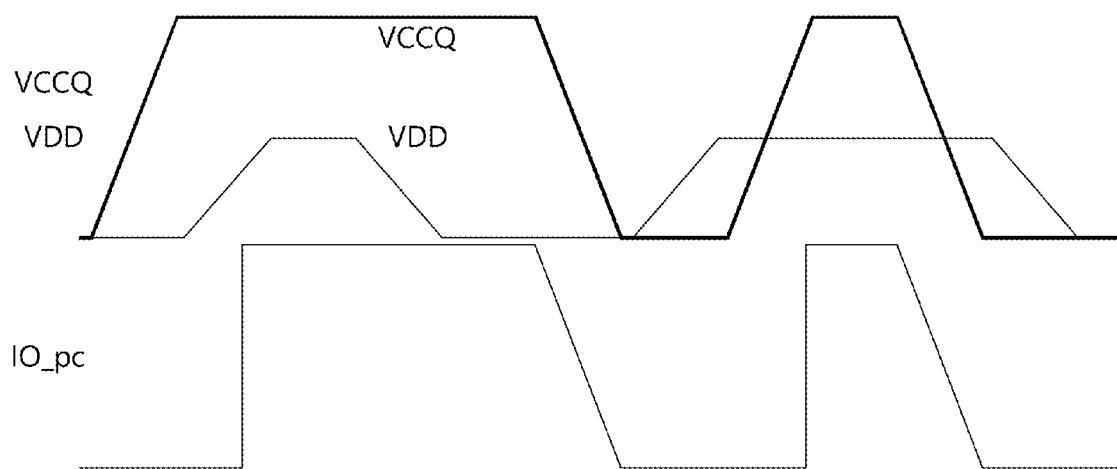
FIG. 6 is a timing diagram for describing an operation of the control circuit of FIG. 2.

The control circuit 100 including the first voltage detection circuit 110, the second voltage detection circuit 120 and the storage and output circuit 130, which operate as described above, may enable the power control signal IO_pc at a high level, when the first voltage VCCQ becomes higher than the first set voltage level and the second voltage VDD becomes higher than the second set voltage level as illustrated in a timing diagram of FIG. 6. On the other hand, when the voltage level of the first voltage VCCQ becomes lower than the first set voltage level, the control circuit 100 may disable the power control signal IO_pc at a low level.

The data input/output circuits 200 of FIG. 1 may be activated only in the enable period of the power control signal IO_pc, and input/output data.

Figure 7:
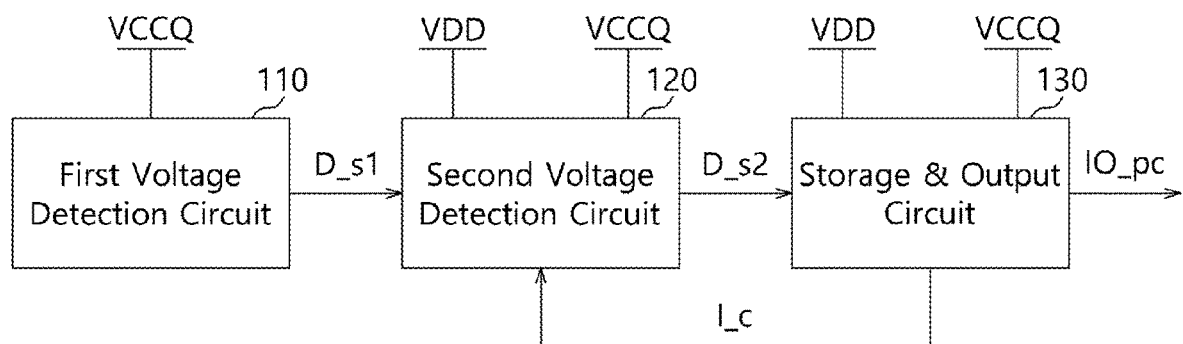
FIG. 7 is a configuration diagram illustrating a control circuit in accordance with another embodiment of FIG. 1.

FIG. 7 is a configuration diagram illustrating one control circuit 100 among the plurality of control circuits 100 illustrated in FIG. 1, showing a different embodiment from the control circuit of FIG. 2.

As illustrated in FIG. 7, the control circuit 100 may include a first voltage detection circuit 110, a second voltage detection circuit 120 and a storage and output circuit 130.

The first voltage detection circuit 110 may generate a first voltage detection signal D_s1 in response to the voltage level of a first voltage VCCQ. For example, the first voltage detection circuit 110 may enable the first voltage detection signal D_s1 at a high level when the voltage level of the first voltage VCCQ becomes equal to or higher than a first set voltage level. On the other hand, when the voltage level of the first voltage VCCQ is lower than the first set voltage level, the first voltage detection circuit 110 may disable the first voltage detection signal D_s1 at a low level.

The second voltage detection circuit 120 may generate the second voltage detection signal D_s2 in response to the first voltage detection signal D_s1, the current control signal I_c and the first and second voltages VCCQ and VDD. For example, when the first voltage detection signal D_s1 is enabled and the voltage level of the second voltage VDD becomes equal to or higher than a second set voltage level, the second voltage detection circuit 120 may enable the second voltage detection signal D_s2 at a high level. On the other hand, when the first voltage detection signal D_s1 is disabled, the second voltage detection circuit 120 may disable the second voltage detection signal D_s2 at a low level. When the second voltage VDD is equal to or lower than a preset voltage level, the second voltage detection circuit 120 may disable the second voltage detection signal D_s2 at a low level. Furthermore, when the current control signal I_c is enabled at a high level, the second voltage detection circuit 120 can reduce power or current consumption thereof.

The storage and output circuit 130 may generate the power control signal IO_pc in response to the second voltage detection signal D_s2 and the voltage level of the second voltage VDD. For example, when the second voltage detection signal D_s2 is enabled and the voltage level of the second voltage VDD is higher than the preset voltage level, the storage and output circuit 130 may enable the current control signal I_c, latch the enabled second voltage detection signal D_s2, and output the latched signal as the power control signal IO_pc. On the other hand, when the second voltage detection signal D_s2 is disabled or the voltage level of the second voltage VDD becomes lower than the preset voltage level, the storage and output circuit 130 may disable the current control signal I_c and disable the power control signal IO_pc at a low level.

At this time, the first voltage VCCQ may be supplied to the plurality of data input/output circuits 200 of FIG. 1, and the second voltage VDD may be supplied to the core circuit 300 of FIG. 1. The power control signal IO_pc may be inputted to the plurality of data input/output circuits 200. The plurality of data input/output circuits 200 may be activated when the power control signal IO_pc is enabled, and deactivated when the power control signal IO_pc is disabled.

Since the first voltage detection circuit 110 of FIG. 7 can be configured in the same manner as the first voltage detection circuit 110 of FIG. 2, the description for the configuration of the first voltage detection circuit 110 of FIG. 7 may be replaced with the description for the configuration of the first voltage detection circuit 110 of FIG. 2.

Figure 8:
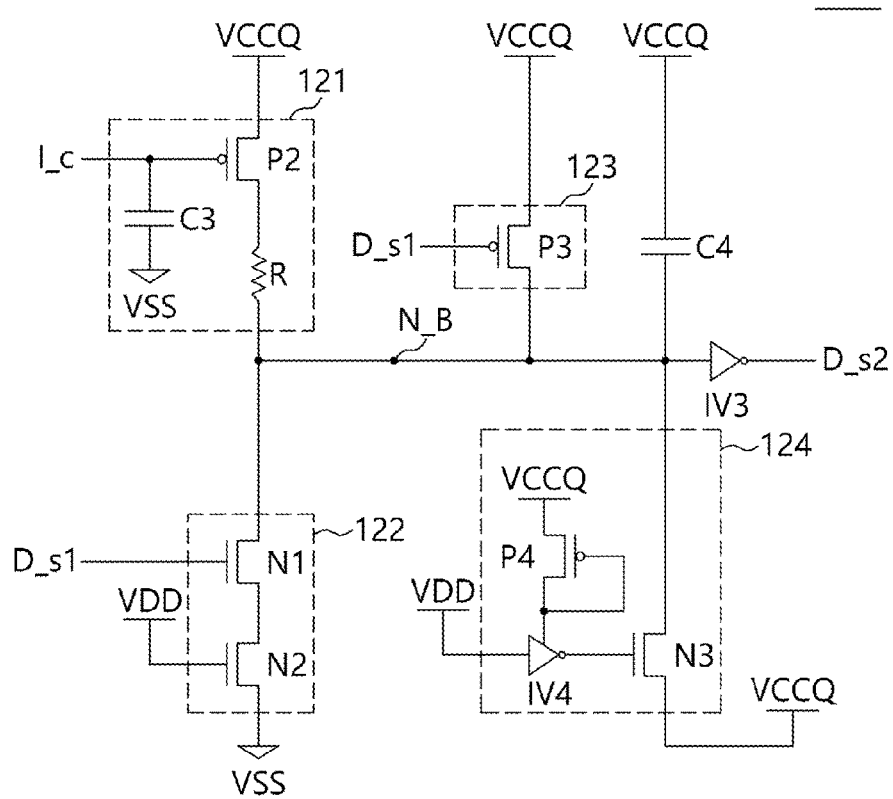
FIG. 8 is a configuration diagram illustrating a second voltage detection circuit of FIG. 7.

FIG. 8 is a configuration diagram illustrating the second voltage detection circuit 120 of FIG. 7.

As illustrated in FIG. 8, the second voltage detection circuit 120 may include a first current source circuit 121, a first current sink circuit 122, a second current source circuit 123, a third current source circuit 124, a third capacitor C3 and a third inverter IV3.

The first current source circuit 121 may supply a current to the second node N_B in response to the current control signal I_c. For example, when the current control signal I_c is disabled at a low level, the first current source circuit 121 may raise the voltage level of the second node N_B by supplying a current to the second node N_B. On the other hand, when the current control signal I_c is enabled at a high level, the first current source circuit 121 may stop supplying the current to the second node N_B.

The first current source circuit 121 may include a third capacitor C3, a second transistor P2 and a resistor R.

The third capacitor C3 may have one terminal coupled to a gate of the second transistor P2 and the other terminal coupled to a ground terminal VSS.

The second transistor P2 may have the gate configured to receive the current control signal I_c, a source configured to receive the first voltage VCCQ, and a drain coupled to one terminal of the resistor R.

The resistor R may have the one terminal coupled to the drain of the second transistor P2 and the other terminal coupled to the second node N_B.

When the first voltage detection signal D_s1 is enabled and the voltage level of the second voltage VDD becomes equal to or higher than the second set voltage level, the first current sink circuit 122 may lower the voltage level of the second node N_B by passing the current of the second node N_B to the ground terminal VSS.

The first current sink circuit 122 may include third and fourth transistors N1 and N2.

The third transistor N1 may have a gate configured to receive the first voltage detection signal D_s1 and a drain coupled to the second node N_B.

The fourth transistor N2 may have a gate configured to receive the second voltage VDD, a drain coupled to the source of the third transistor N1, and a source coupled to the ground terminal VSS.

When the first voltage detection signal D_s1 is disabled, the second current source circuit 123 may raise the voltage level of the second node N_B by supplying a current to the second node N_B.

The second current source circuit 123 may include a fifth transistor P3.

The fifth transistor P3 may have a gate configured to receive the first voltage detection signal D_s1, a source configured to receive the first voltage VCCQ, and a drain coupled to the second node N_B.

When the voltage level of the first voltage VCCQ becomes higher than the first set voltage level and the voltage level of the second voltage VDD is lower than the second set voltage level, the third current source circuit 124 may raise the voltage level of the second node N_B by applying a current to the second node N_B. When the voltage level of the second voltage VDD is higher than the second set voltage level, the third current source circuit 124 may interrupt the current applied to the second node N_B.

The third current source circuit 124 may be configured to perform a fourth inversion operation. For example, the third current source circuit 124 may include a sixth transistor N3, a seventh transistor P4 and a fourth inverter IV4.

The sixth transistor N3 may have a gate configured to receive an output signal of the fourth inverter IV4, a drain coupled to the second node N_B, and a source configured to receive the first voltage VCCQ.

The seventh transistor P4 may have a source configured to receive the first voltage VCCQ and a gate and drain coupled in common.

The fourth inverter IV4 may have an input terminal configured to receive the second voltage VDD and a voltage terminal coupled to the drain of the seventh transistor P4.

The fourth capacitor C4 may have one terminal configured to receive the first voltage VCCQ and the other terminal coupled to the second node N_B.

The third inverter IV3 may invert the voltage level of the second node N_B and output the inverted voltage level as the second voltage detection signal D_s2. The third inverter IV3 may have an input terminal coupled to the second node N_B and an output terminal configured to output the second voltage detection signal D_s2.

Figure 9:
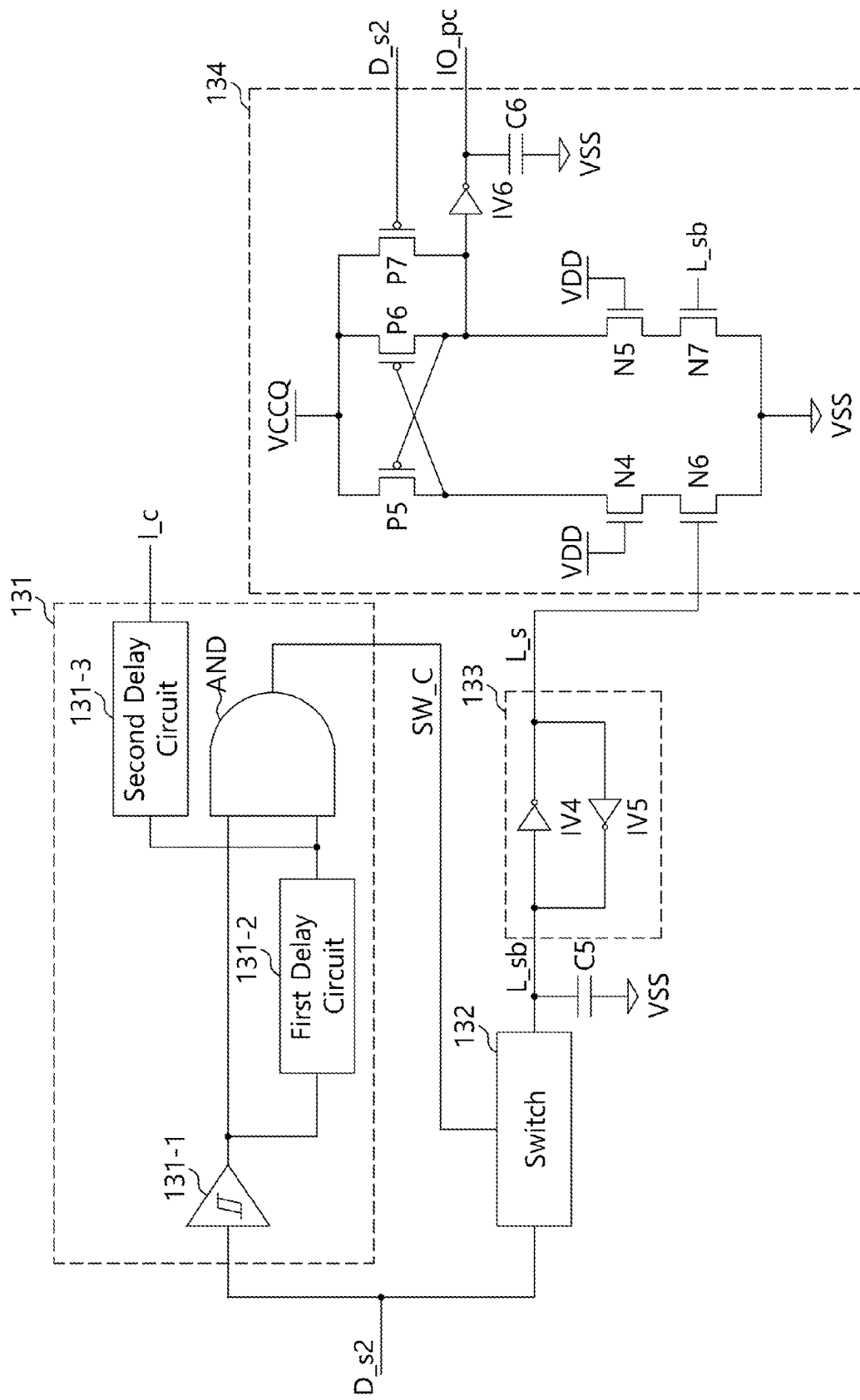
FIG. 9 is a configuration diagram illustrating a storage and output circuit of FIG. 7.

FIG. 9 is a configuration diagram illustrating the storage and output circuit 130 of FIG. 7.

As illustrated in FIG. 9, the storage and output circuit 130 may include a control signal generation circuit 131, a switch 132, a latch circuit 133, a fifth capacitor C5 and a power control signal output circuit 134.

When the second voltage detection signal D_s2 is enabled, the control signal generation circuit 131 may enable a switch control signal SW_c and the current control signal I_c. For example, when the second voltage detection signal D_s2 is enabled, the control signal generation circuit 131 may enable the switch control signal SW_c for a preset time. Furthermore, the control signal generation circuit 131 may enable the current control signal I_c when the second voltage detection signal D_s2 is enabled, and disable the current control signal I_c when the second voltage detection signal D_s2 is disabled. When enabled by the second voltage detection signal D_s2, the switch control signal SW_c may be disabled after retaining the enabled state for the preset time.

The control signal generation circuit 131 may include a Schmitt trigger circuit 131-1, a first delay circuit 131-2, and a second delay circuit 131-2. The control signal generation circuit 131 may also be configured to perform an AND operation. For example, control signal generation circuit 131 may include an AND gate AND.

The Schmitt trigger circuit 131-1 may generate a high-level output signal when the voltage level of the second voltage detection signal D_s2 becomes higher than a preset voltage level or the second voltage detection signal D_s2 is enabled at a high level. On the other hand, the Schmitt trigger circuit 131-1 may generate a low-level output signal when the voltage level of the second voltage detection signal D_s2 becomes lower than the preset voltage level or the second voltage detection signal D_s2 is disabled at a low level.

The first delay circuit 131-2 may delay and invert the output signal of the Schmitt trigger circuit 131-1, and output the delayed and inverted signal.

The second delay circuit 131-3 may delay and invert the output signal of the first delay circuit 131-2, and output the delayed and inverted signal as the current control signal I_c.

The AND gate AND may receive the output signals of the Schmitt trigger circuit 131-1 and the first delay circuit 131-2, and generate the switch control signal SW_c. For example, the AND gate AND may generate the switch control signal SW_c which is enabled at a high level only during a period in which both of the output signals of the Schmitt trigger circuit 131-1 and the first delay circuit 131-2 are at a high level. At this time, the enable period of the switch control signal SW_c may be equal to the delay time of the first delay circuit 131-2.

When the switch control signal SW_c is enabled, the switch 132 may output the second voltage detection signal D_s2 as a latch inversion signal L_sb. On the other hand, when the switch control signal SW_c is disabled, the switch 132 may stop the operation of outputting the second voltage detection signal D_s2 as the latch inversion signal L_sb.

The latch circuit 133 may latch and invert the latch inversion signal L_sb, and output the latched and inverted signal as a latch signal L_s.

The latch circuit 133 may be configured to perform a fourth and fifth inversion operation. For example, the latch circuit 133 may include fourth and fifth inverters IV4 and IV5.

The fourth inverter IV4 may receive the latch inversion signal L_sb, invert the received signal, and output the inverted signal as the latch signal L_s.

The fifth inverter IV5 may receive the output signal of the fourth inverter IV4, invert the received signal, and input the inverted signal as an input signal of the fourth inverter IV4.

At this time, the fifth capacitor C5 may be coupled to a node to which the switch 132 and the latch circuit 133 are coupled. The fifth capacitor C5 may have one terminal coupled to the node to which the switch 132 and the latch circuit 133 are coupled and the other terminal coupled to the ground terminal VSS. The switch 132 may transfer the second voltage detection signal D_s2 to the latch circuit 133 when the switch control signal SW_c is enabled, and electrically separate the second voltage detection signal D_s2 from the latch circuit 133 when the switch control signal SW_c is disabled.

The power control signal output circuit 134 may be configured to perform a sixth inversion operation. For example, the power control signal output circuit 134 may include eighth to 14th transistors N4 to N7 and P4 to P6, a sixth inverter IV6 and a sixth capacitor C6.

The eighth transistor N4 may have a gate configured to receive the second voltage VDD.

The ninth transistor N5 may have a gate configured to receive the second voltage VDD.

The tenth transistor N6 may have a gate configured to receive the latch signal L_s, a source coupled to the ground terminal VSS, and a drain coupled to the source of the eighth transistor N4.

The 11th transistor N7 may have a gate configured to receive the latch inversion signal L_sb, a source coupled to the ground terminal VSS, and a drain coupled to the source of the ninth transistor N5.

The 12th transistor P5 may have a gate coupled to the drain of the ninth transistor N5, a source configured to receive the first voltage VCCQ, and a drain coupled to the drain of the eighth transistor N4.

The 13th transistor P6 may have a gate coupled to the drain of the eighth transistor N4, a source configured to receive the first voltage VCCQ, and a drain coupled to the drain of the ninth transistor N5.

The 14th transistor P7 may have a gate configured to receive the second voltage detection signal D_s2, a source configured to receive the first voltage VCCQ, and a drain coupled to a node to which the ninth and 13th transistors N5 and P6 are coupled in common.

The sixth inverter IV6 may have an input terminal coupled to a node to which the ninth, 13th and 14th transistors N5, P6 and P7 are coupled in common, and an output terminal configured to output the power control signal IO_pc.

The sixth capacitor C6 may have one terminal coupled to the output terminal of the sixth inverter IV6 and the other terminal coupled to the ground terminal VSS.

Referring to FIGS. 7 to 10, the semiconductor apparatus having the above-described configuration in accordance with the present embodiment will be described as follows.

Referring to FIG. 3, the operation of the first voltage detection circuit 110 will be described.

When the voltage level of the first voltage VCCQ becomes higher than the first set voltage level, the first transistor P1 may be turned on to raise the voltage level of the first node N_A. The voltage level of the first node N_A may be outputted as the first voltage detection signal D_s1 through the first and second inverters IV1 and IV2.

Consequently, when the voltage level of the first voltage VCCQ becomes higher than the first set voltage level, the first voltage detection circuit 110 may enable the first voltage detection signal D_s1 at a high level.

Referring to FIG. 8, the operation of the second voltage detection circuit 120 will be described.

When the current control signal I_c is disabled at a low level, the first current source circuit 121 may raise the voltage level of the second node N_B by supplying a current to the second node N_B.

When the first voltage detection signal D_s1 is enabled at a high level and the voltage level of the second voltage VDD becomes higher than the second set voltage level, the first current sink circuit 122 may lower the voltage level of the second node N_B by passing the current of the second node N_B to the ground terminal VSS.

When the first voltage detection signal D_s1 is disabled at a low level, the second current source circuit 123 may raise the voltage level of the second node N_B by supplying a current to the second node N_B.

When the voltage level of the first voltage VCCQ becomes higher than the first set voltage level and the voltage level of the second voltage VDD becomes lower than the second set voltage level, the third current source circuit 124 may raise the voltage level of the second node N_B by applying a current to the second node N_B. When the voltage level of the second voltage VDD becomes higher than the second set voltage level, the third current source circuit 124 may interrupt the current applied to the second node N_B.

The third inverter IV3 may invert the voltage level of the second node N_B and output the inverted voltage level as the second voltage detection signal D_s2.

Consequently, when the first voltage detection signal D_s1 is enabled at a high level and the voltage level of the second voltage VDD becomes higher than the second set voltage level, the second voltage detection circuit 120 may enable the second voltage detection signal D_s2 at a high level. On the other hand, when the first voltage detection signal D_s1 is disabled at a low level or the current control signal I_c is disabled at a low level, the second voltage detection circuit 120 may disable the second voltage detection signal D_s2 at a low level.

Referring to FIG. 9, the operation of the storage and output circuit 130 will be described.

The second voltage detection signal D_s2 may be delayed by the delay times of the first and second delay circuits 131-2 and 131-3, and outputted as the current control signal I_c.

When the second voltage detection signal D_s2 is enabled, the switch control signal SW_c having an enable period corresponding to the delay time of the first delay circuit 131-2 may be generated.

During the enable period of the switch control signal SW_c, the second voltage detection signal D_s2 may be inputted to the latch circuit 133.

The latch circuit 133 may latch the second voltage detection signal D_s2, and output the latched signal as the latch signal L_s and the latch inversion signal L_sb. At this time, the latch signal L_s and the latch inversion signal L_sb may have levels opposite to each other.

When the latch signal L_s is enabled at a high level or the second voltage VDD becomes lower than the preset voltage level, the power control signal output circuit 134 may output the power control signal IO_pc which is disabled at a low level. On the other hand, when the latch signal L_s is disabled at a low level or the second voltage VDD becomes higher than the preset voltage level, the power control signal output circuit 134 may output the power control signal IO_pc which is enabled at a high level. Furthermore, when the second voltage detection signal D_s2 is disabled at a low level, the power control signal output circuit 134 may output the power control signal IO_pc which is disabled at a low level.

Consequently, when the second voltage VDD is higher than the preset voltage level and the second voltage detection signal D_s2 is enabled at a high level, the storage and output circuit 130 may output the current control signal I_c and the power control signal IO_pc which are enabled at a high level. When the second voltage detection signal D_s2 is disabled at a low level or the second voltage VDD is lower than the preset voltage level, the storage and output circuit 130 may output the current control signal I_c and the power control signal IO_pc which are disabled at a low level.

Figure 10:
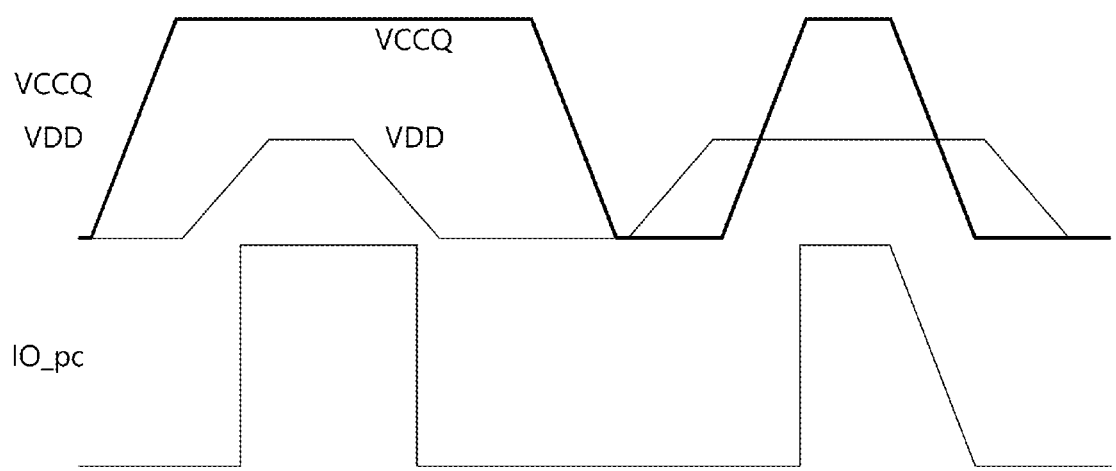
FIG. 10 is a timing diagram for describing an operation of the control circuit of FIG. 7.

The control circuit 100 including the first voltage detection circuit 110, the second voltage detection circuit 120 and the storage and output circuit 130, which operate as described above, may enable the power control signal IO_pc at a high level, when the first voltage VCCQ becomes higher than the first set voltage level and the second voltage VDD becomes higher than the second set voltage level as illustrated in the timing diagram of FIG. 10. On the other hand, when the voltage level of the first voltage VCCQ becomes lower than the first set voltage level or the second voltage VDD becomes lower than the second set voltage level, the control circuit 100 may disable the power control signal IO_pc at a low level.

The data input/output circuits 200 of FIG. 1 may be activated only in the enable period of the power control signal IO_pc, and input/output data.

The control circuit illustrated in FIGS. 2 and 3 may activate the data input/output circuits only when both of the first and second voltages become higher than the set voltage levels. The control circuit of FIG. 2 may deactivate the data input/output circuit when the first voltage becomes lower than the preset voltage level, and the control circuit of FIG. 3 may deactivate the data input/output circuit when any one of the first and second voltages becomes lower than the preset voltage level.

The semiconductor apparatus in accordance with the present embodiment can reduce power consumption.

While various embodiments have been described above, it will be understood to those skilled in the art that the embodiments described are examples only. Accordingly, the operating method of a data storage device described herein should not be limited based on the described embodiments.

What is claimed is:

1. A semiconductor apparatus comprising:
   a first voltage detection circuit configured to generate a first voltage detection signal by detecting a voltage level of a first voltage;
   a second voltage detection circuit configured to generate a second voltage detection signal by detecting a voltage level of a second voltage in response to the voltage level of the second voltage, a current control signal and the first voltage detection signal; and
   a storage and output circuit configured to generate a power control signal and the current control signal in response to the second voltage detection signal.

2. The semiconductor apparatus according to claim 1, wherein, when the voltage level of the second voltage becomes equal to or higher than a set voltage level, the second voltage detection circuit enables the second voltage detection signal.

3. The semiconductor apparatus according to claim 1, wherein the second voltage detection circuit enables the second voltage detection signal when the first voltage detection signal is enabled and the voltage level of the second voltage becomes equal to or higher than the set voltage level, and disables the second voltage detection signal when the first voltage detection signal is disabled.

4. The semiconductor apparatus according to claim 3, wherein the second voltage detection circuit disables the second voltage detection signal when the current control signal is enabled.

5. The semiconductor apparatus according to claim 1, wherein when the second voltage detection signal is enabled, the storage and output circuit latches the second voltage detection signal and outputs the latched signal as the power control signal, and delays the second voltage detection signal, outputs the delayed second voltage detection signal as the current control signal.

6. A semiconductor apparatus comprising:
a first voltage detection circuit configured to enable a first voltage detection signal when the voltage level of a first voltage becomes higher than a first set voltage level;
a second voltage detection circuit configured to enable a second voltage detection signal when the first voltage detection signal is enabled and the voltage level of a second voltage becomes higher than a second set voltage level, and configured to disable the second voltage detection signal in response to a current control signal; and
a storage and output circuit configured to enable the current control signal when the second voltage detection signal is enabled, and configured to generate a power control signal by latching the enabled second voltage detection signal.

7. The semiconductor apparatus according to claim 6, wherein the second voltage detection circuit disables the second voltage detection signal when the first voltage detection signal is disabled,
wherein the second voltage detection circuit enables the second voltage detection signal when the first voltage detection signal is enabled and the voltage level of the second voltage becomes higher than the second set voltage level, and
wherein the second voltage detection circuit disables the second voltage detection signal when the current control signal is enabled.

8. The semiconductor apparatus according to claim 7, wherein the second voltage detection circuit comprises:
a first current source circuit configured to raise the voltage level of an input node of an inverter by passing a current to the input node in response to the current control signal;
a current sink circuit configured to lower the voltage level of the input node by sinking the current from the input node in response to the first voltage detection signal and the voltage level of the second voltage;
a second current source circuit configured to raise the voltage level of the input node by passing a current to the input node in response to the first voltage detection signal;
a third current source circuit configured to raise the voltage level of the input node by passing a current to the input node in response to the current control signal; and
the inverter configured to receive the voltage level of the input node and output the second voltage detection signal.

9. The semiconductor apparatus according to claim 8, wherein the first current source circuit comprises:
a capacitor having one terminal configured to receive the current control signal and the other terminal coupled to a ground terminal;
a transistor having a gate configured to receive the current control signal and a source configured to receive the first voltage; and
a resistor having one terminal coupled to a drain of the transistor and the other terminal coupled to the input node.

10. The semiconductor apparatus according to claim 8, wherein the third current source circuit has a drain configured to receive the first voltage, a gate configured to receive the current control signal, and a source coupled to the input node.

11. The semiconductor apparatus according to claim 8, wherein the current sink circuit comprises:
a first transistor having a gate configured to receive the second voltage and a source coupled to a ground terminal; and
a second transistor having a gate configured to receive the first voltage detection signal, a drain coupled to the input node, and a source coupled to a drain of the first transistor.

12. The semiconductor apparatus according to claim 6, wherein the storage and output circuit comprises:
a control signal generation circuit configured to generate a switch control signal which is enabled during a set period when the second voltage detection signal is enabled, and delay the second voltage detection signal and output the delayed signal as the current control signal;
a switch configured to output the second voltage detection signal as a latch inversion signal during a period in which the switch control signal is enabled;
a latch circuit configured to latch and invert the latch inversion signal and output the latched and inverted signal as a latch signal; and
a power control signal output circuit configured to generate the power control signal by comparing the voltage levels of the latch inversion signal and the latch signal.

13. The semiconductor apparatus according to claim 12, wherein the control signal generation circuit comprises:
a Schmitt trigger circuit configured to generate a high-level output signal when the second voltage detection signal is enabled and configured to generate a low-level output signal when the second voltage detection signal is disabled;
a first delay circuit configured to delay and invert either the high-level output signal or the low-level output signal of the Schmitt Trigger circuit and configured to output a delayed and inverted signal;
a second delay circuit configured to delay and invert either the high-level output signal or the low-level output signal of the first delay circuit and configured to output another delayed and inverted signal as the current control signal; and
an AND gate configured to receive either the high-level output signal or the low-level output signal of the Schmitt trigger circuit and the delayed and inverted signal outputted from the first delay circuit and configured to output the switch control signal.

14. The semiconductor apparatus according to claim 12, wherein the power control signal output circuit comprises:

a first transistor with a first gate configured to receive the latch signal from the latch circuit, with a first source configured to be coupled to a ground terminal, and with a first drain;

a second transistor with a second gate configured to receive the latch inversion signal, with a second source configured to be coupled to the ground terminal, and with a second drain;

a third transistor with a third gate configured to be coupled to the drain of the second transistor, with a third source configured to receive the first voltage, and with a third drain configured to be coupled to the first drain of the first transistor;

a fourth transistor with a fourth gate configured to be coupled to the drain of the first transistor, with a fourth source configured to receive the first voltage, and with a fourth drain configured to be coupled to the second drain of the first transistor;

a fifth transistor with a fifth gate configured to receive the second voltage detection signal, with a fifth source configured to receive the first voltage, and with a fifth drain configured to be coupled to a node to which the second and fourth transistors are coupled in common;

an inverter configured to have an input terminal coupled to a node to which the second, fourth, and fifth transistors are coupled in common and configured to have an output terminal to output the power control signal; and a capacitor configured to have one terminal coupled to the output terminal of the inverter and configured to have the other terminal coupled to the ground terminal.

15. A semiconductor apparatus comprising:
a first voltage detection circuit configured to enable a first voltage detection signal when the voltage level of a first voltage becomes higher than a first set voltage level;

a second voltage detection circuit configured to enable a second voltage detection signal when the first voltage detection signal is enabled and the voltage level of a second voltage becomes higher a second set voltage level, and disable the second voltage detection signal when the voltage level of the first voltage becomes higher than the first set voltage level and the second voltage is lower than the second set voltage level; and a storage and output circuit configured to enable the current control signal when the second voltage detection signal is enabled, and generate a power control signal by latching the enabled second voltage detection signal.

16. The semiconductor apparatus according to claim 15, wherein the second voltage detection circuit comprises:
a current sink circuit configured to lower the voltage level of an input node of an inverter by sinking a current from the input node in response to the first voltage detection signal and the voltage level of the second voltage;

a current source circuit configured to raise the voltage level of the input node by passing a current to the input node when the voltage level of the first voltage is higher than the first set voltage level and the voltage level of the second voltage is lower than the second set voltage level; and the inverter configured to receive the voltage level of the input node and output the second voltage detection signal.

* * * * *